United States Patent
Hatakeyama et al.

(10) Patent No.: US 6,949,735 B1
(45) Date of Patent: Sep. 27, 2005

(54) BEAM SOURCE

(75) Inventors: Masahiro Hatakeyama, Tokyo (JP); Katsunori Ichiki, Kanagawa (JP); Kenji Watanabe, Tokyo (JP); Tohru Satake, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/030,087

(22) PCT Filed: Jul. 14, 2000

(86) PCT No.: PCT/JP00/04744

§ 371 (c)(1), (2), (4) Date: Jan. 14, 2002

(87) PCT Pub. No.: WO01/06534

PCT Pub. Date: Jan. 25, 2001

(30) Foreign Application Priority Data

Jul. 14, 1999 (JP) .................................. 11-200989

(51) Int. Cl.$^7$ ............................................. H05H 3/00
(52) U.S. Cl. ..................................................... 250/251
(58) Field of Search .............................. 250/251, 423 R, 250/492.21; 315/111.81; 313/359.1

(56) References Cited

U.S. PATENT DOCUMENTS

| | | | |
|---|---|---|---|
| 4,021,276 A * | 5/1977 | Cho et al. ................. | 156/644 |
| 4,870,284 A * | 9/1989 | Hashimoto et al. ...... | 250/423 R |
| 5,216,330 A * | 6/1993 | Ahonen .................... | 315/111.51 |
| 5,518,572 A * | 5/1996 | Kinoshita et al. ........ | 156/345 |
| 5,883,470 A * | 3/1999 | Hatakeyama et al. ... | 315/111.81 |
| 5,969,366 A * | 10/1999 | England et al. .......... | 250/492.21 |
| 5,983,828 A * | 11/1999 | Savas ....................... | 118/723 I |
| 6,331,701 B1 * | 12/2001 | Chen et al. ............... | 250/251 |
| 2002/0011560 A1 * | 1/2002 | Sheehan et al. ......... | 250/283 |

FOREIGN PATENT DOCUMENTS

| | | |
|---|---|---|
| EP | 848 434 | 6/1998 |
| JP | 6-36695 | 2/1994 |
| JP | 6-124682 | 5/1994 |
| JP | 8-45457 | 2/1996 |
| JP | 10-229213 | 8/1998 |
| JP | 2000-164580 | 6/2000 |

* cited by examiner

Primary Examiner—John R. Lee
Assistant Examiner—Phillip A. Johnston
(74) Attorney, Agent, or Firm—Westerman, Hattori, Daniels & Adrian, LLP

(57) ABSTRACT

An object of the present invention is to provide a beam source capable of efficiently generating a high-density energy beam having good directivity and a relatively large beam diameter. The beam source of the present invention comprises a discharge tube; a gas inlet for introducing gas into the discharge tube; three electrodes mounted in the discharge tube downstream from the gas inlet, wherein the electrode on the upstream end has a plurality of openings through which the gas can pass, the middle electrode is a mesh-shaped electrode, and the electrode on the downstream end is a beam-emitting electrode having a plurality of beam-emitting holes and is disposed in a plane parallel to the middle electrode; plasma-generating means disposed between the two upstream electrodes on the outside of the discharge tube for transforming gas introduced into the discharge tube into plasma; and voltage-applying means for accelerating the beam between the two downstream electrodes and emitting the accelerated beam from the downstream beam-emitting electrode.

7 Claims, 7 Drawing Sheets distance between the mesh electrode
and beam-emitting electrode L (mm)

BEAM SOURCE

TECHNICAL FIELD

The present invention relates to a beam source for generating a high-density ion beam, neutral particle beam, or the like having good directivity from high-density plasma.

BACKGROUND ART

In recent years, there has been a remarkable reduction in the size of processing patterns used in semiconductor ICs, data storage media including hard disks, micro-machines, and other fields. Processing technologies, such as deposition and etching, used in these fields now require relatively broad irradiating energy beams such as high-density neutral particle beams or ion beams having high collimation (good directivity). The inventors of the present invention and others have already disclosed beam sources having the following constructions for such applications.

The first type of beam source comprises a discharge tube, a gas feed nozzle disposed upstream from the discharge tube for supplying gas therein, a beam-emitting electrode formed with a plurality of apertures and disposed on the downstream end of the discharge tube, and a plurality of electrodes disposed within the discharge tube. By applying a combination of different voltages to these electrodes, including a radio-frequency (RF) voltage, direct-current voltage, and ground voltage and by varying the type of gas introduced into the discharge tube, the beam source can generate different energy-level beams of differing types, such as positive ions, negative ions, neutral particles, radicals, and the like. A beam source of this construction is relatively compact and can be mounted on a manipulator to irradiate a beam onto a desired target in order to perform such localized processes on the target as deposition, etching, adhesion, bonding, and the like.

The second beam source is configured as the first with a nozzle disposed upstream from a cylindrical discharge tube for introducing gas therein, and a beam-emitting electrode (cathode) disposed downstream and formed with a plurality of apertures. This beam source also comprises an anode disposed in the discharge tube on the upstream end, a mechanism for applying a DC voltage across the anode and cathode, and an inductively coupled plasma-generating mechanism for converting gas in the discharge tube between these electrodes into plasma. A neutral particle beam source having this construction can generate high-density plasma from gas introduced into the discharge tube according to the inductively coupled high-frequency plasma-generating mechanism and can accelerate positive ions in the plasma on the cathode side using the two parallel electrodes. Charge exchange takes place in high-speed atom emission holes formed in the cathode on the downstream end, resulting in the emission of a neutral particle beam.

Unlike the above-described direct-current discharge beam source, this neutral particle beam source is provided with a plasma-generating section and an accelerating voltage section capable of generating high-density plasma at a low energy. Since a desired voltage from a low to a high voltage can be applied across the two electrodes, the beam source can generate a neutral particle beam at a desired energy level from a low energy to a high energy. Since the anode and cathode are disposed parallel to each other it is possible to generate a neutral particle beam with good directivity (collimation) and having a relatively high neutralization rate by controlling the length of the high-speed atom emission holes.

However, the above-described beam sources have not always been sufficient for forming high-density plasma and for efficiently extracting from this plasma an energy beam, such as an ion beam or neutral particle beam, having high directivity and high density.

DISCLOSURE OF INVENTION

In view of the foregoing, it is an object of the present invention to provide a beam source capable of efficiently generating a high-density energy beam having good directivity and a relatively large beam diameter.

These objects and others will be attained by a beam source comprising a discharge tube; a gas inlet for introducing gas into the discharge tube; three electrodes mounted in the discharge tube downstream from the gas inlet, wherein the electrode on the upstream end has a plurality of openings through which the gas can pass, the middle electrode is a mesh-shaped electrode, and the electrode on the downstream end is a beam-emitting electrode having a plurality of beam-emitting holes and is disposed in a plane parallel to the middle electrode; plasma-generating means disposed between the two upstream electrodes on the outside of the discharge tube for transforming gas introduced into the discharge tube into plasma; and voltage-applying means for accelerating the beam between the two downstream electrodes and emitting the accelerated beam from the downstream beam-emitting electrode.

The present invention has a plasma-generating means for forming high-density plasma from gas introduced into the discharge tube between the two upstream electrodes. Since the middle electrode is a thin mesh-type electrode having a plurality of openings, high-density plasma formed on the upstream side of this electrode is efficiently introduced between the two electrodes on the downstream end. The two downstream electrodes are parallel to each other, and a voltage is applied thereacross to accelerate the charged particles. These accelerated particles are emitted through the electrode disposed on the downstream end of the discharge tube that is formed with a plurality of beam emitting holes. Accordingly, an ion beam is efficiently extracted from the high-density plasma, generating a highly ionized and relatively broad beam having good directivity.

Further, the two electrodes on the upstream end have the same potential, while the beam-emitting electrode on the downstream end has the same potential as that of a chamber into which the beam is emitted.

Setting the two upstream electrodes at the same potential stabilizes the potential of plasma formed therebetween, enabling the potential to be controlled as desired. Further, since the potential of the downstream electrode is the same as that of the chamber into which plasma is discharged, it is possible to emit ions accelerated between the two downstream electrodes as an energy beam, such as an ion beam or a neutral particle beam, into the chamber.

Further, the mesh electrode is formed of a conductive material in a thin plate shape and has a plurality of openings. The open area ratio of the electrode should be 85% or less. Accordingly, a charged particle beam can be easily formed from the high-density plasma between the two downstream electrodes with a relatively short sheath length.

Further, the two electrodes on the downstream end are separated by a distance of 5 millimeters or greater, and preferably by a distance of 10–30 millimeters. Accordingly, a relatively low-energy beam appropriate for micro-fabrication can be efficiently extracted from the high-density plasma.

Further, each of the beam-emitting holes formed in the beam-emitting electrode on the downstream end has a length-to-diameter ratio of 2 or greater. Accordingly, the accelerated beam between the two downstream electrodes can be emitted without loss of directivity or density.

Further, the voltage-applying means applies a positive-negative pulse-type voltage that alternately irradiates either positive ions and negative ions or positive ions and electrons. Accordingly, by alternately irradiating positive ions and negative ions (or electrons), high-precision etching and deposition processes can be conducted while reducing the amount of charge buildup on the surfaces of insulating materials, such as glass and ceramic materials.

BEST MODE FOR CARRYING OUT THE INVENTION

A beam source according to preferred embodiments of the present invention will be described while referring to the accompanying drawings.

Figure 1:
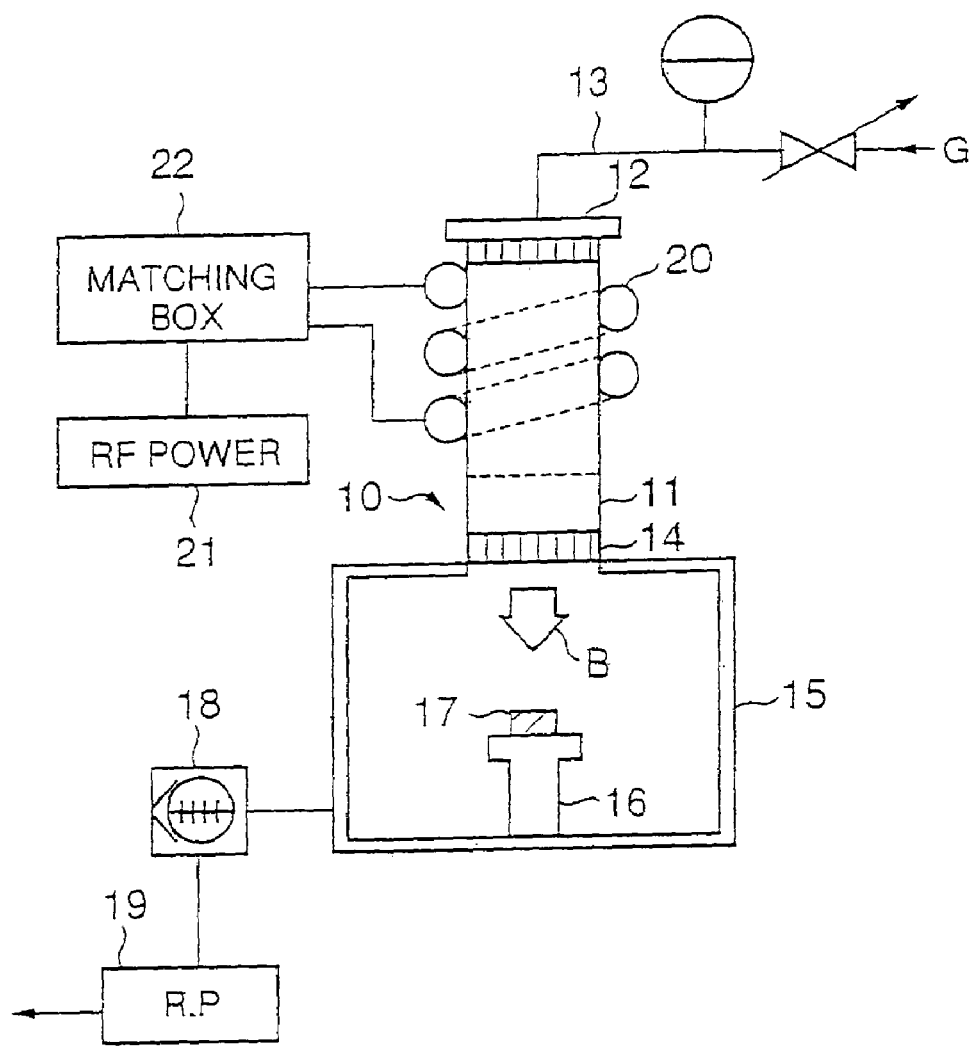
FIG. 1 is an explanatory diagram showing the overall configuration of a micro-fabrication apparatus employing a beam source.

FIG. 1 is an explanatory diagram showing the overall construction of a processing apparatus employing a beam source according to a preferred embodiment of the present invention. A beam source 10 comprises a discharge tube 11 and a plasma forming means (a coil 20 and the like) disposed external to the discharge tube 11. The plasma forming means converts gas introduced through a gas inlet 12 into plasma. The inside of the discharge tube 11 and an adjacent chamber 15 are evacuated to form a high vacuum using a turbo-molecular pump 18 and a rotary pump 19. An inductively coupled coil 20 is disposed around the discharge tube 11. A radio-frequency power source 21 supplies an RF power of 13.56 MHz, for example, to the coil 20 via a matching box 22 to convert gas introduced into the discharge tube 11 into plasma. The coil 20 is a water-cooled pipe type coil, for example, having an external diameter of approximately 8 millimeters and is surrounded around the discharge tube 11 approximately two turns.

Charged particles including positive or negative ions from plasma formed in the discharge tube are accelerated, emitting an energy beam, such as an ion beam or a neutral particle beam, from an electrode 14 on the downstream end of the discharge tube 11 into the beam discharge chamber 15. A gas feed pipe 13 introduces a gas, such as $SF_6$, $CHF_3$, $CF_4$, $Cl_2$, Ar, $O_2$, $N_2$, and $C_4F_8$, into the discharge tube 11, forming an energy beam, such as an ion beam or a neutral particle beam, from elements or molecules in this gas. The beam collimates in the chamber 15 and irradiates a sample 17 mounted on a sample support 16.

Figure 2:
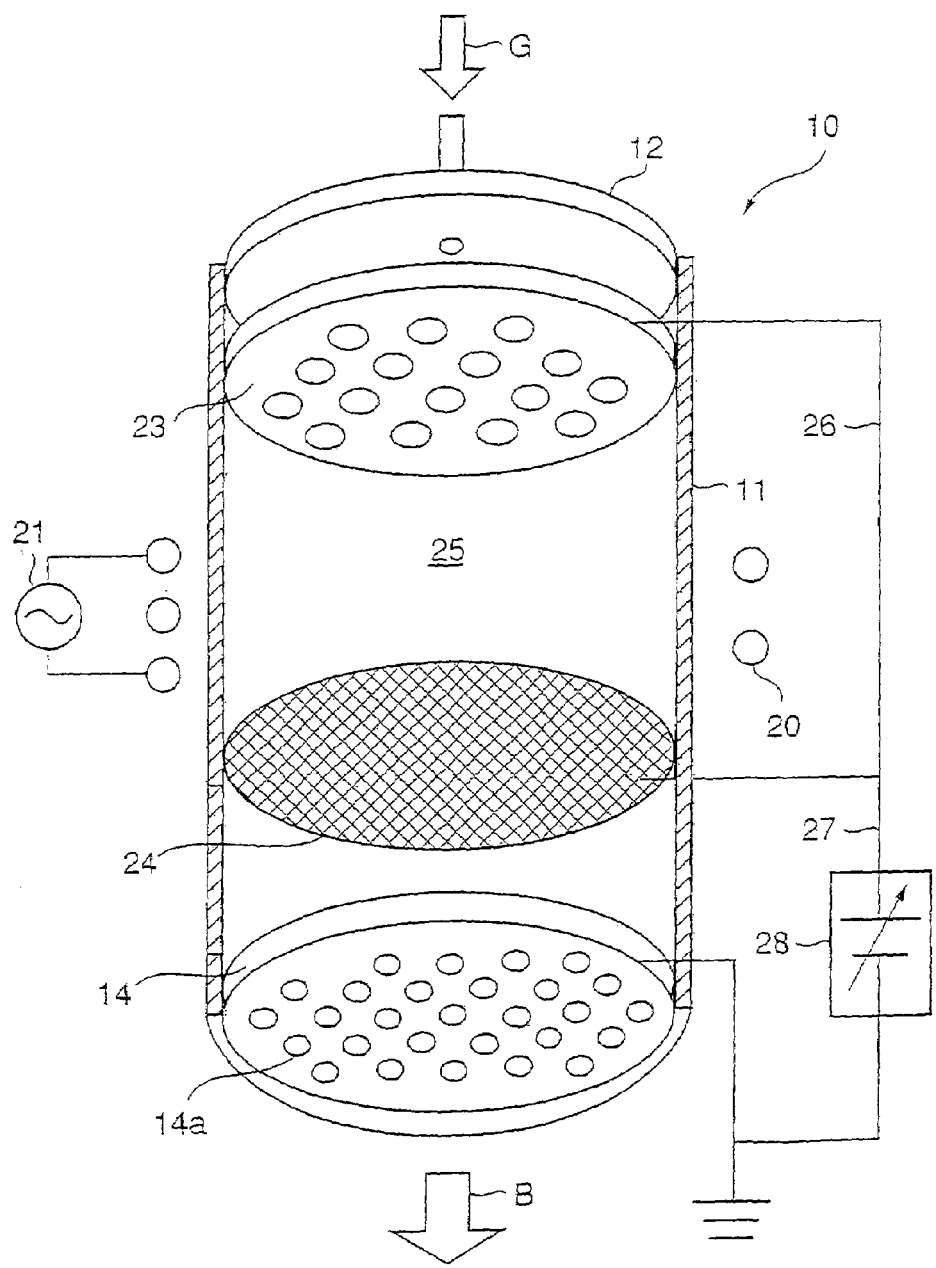
FIG. 2 is a perspective view showing the construction of a beam source according to a first embodiment of the present invention.

FIG. 2 shows the construction of the beam source according to the first embodiment of the present invention. The discharge tube 11 is cylindrically shaped and configured of a tube formed of quartz glass, ceramic, or the like. The discharge tube 11 is a hermetically sealed construction formed by the gas inlet 12 disposed on the upstream end of the discharge tube 11 for introducing gas therein, and the beam-emitting electrode 14 disposed on the downstream end of the discharge tube 11 and formed with a plurality of beam-emitting holes 14a for emitting the beam formed in the discharge tube 11. Within the discharge tube 11 are disposed an upstream electrode 23 formed with a plurality of openings that enable the passage of gas through the upstream end, and a mesh electrode 24 comprising a thin plate formed with a plurality of openings. A means is provided for converting gas introduced between the upstream electrode 23 and middle mesh electrode 24 into plasma. In the present embodiment, this means is the RF coil 20 provided for forming inductively coupled plasma. A high frequency magnetic field is formed in the discharge tube 11 by supplying an RF current at, for example, 13.56 MHz from the power source 21. The gas introduced between the upstream electrode 23 and mesh electrode 24 is excited by this magnetic field and transformed into plasma. In addition to the ICP generating coil described above, it is also possible to employ an ECR, helicon wave plasma coil, electromagnetic coil, microwaves, or the like to generate plasma. The plasma-generating device can use a frequency within the range from 1 MHz to 20 GHz and is not limited to 13.56 MHz.

The RF current supplied to the coil 20 generates a magnetic field in a plasma chamber 25 formed between the upstream electrode 23 and mesh electrode 24. The magnetic field couples with gas G introduced through the gas inlet 12 to form high-density plasma having an electron density of $10^{11}$–$10^{12}$/cm$^3$. As shown in the diagram, the upstream electrode 23 and mesh electrode 24 are electrically connected by wiring 26 and maintained at approximately the same potential. As a result, the plasma formed in the chamber 25 between the upstream electrode 23 and mesh electrode 24 has approximately the same potential as that applied to the upstream electrode 23 and mesh electrode 24. For example, if the introduced gas is $FS_6$, the input RF power is approximately 150 Watts. In the present embodiment, the diameter of the discharge tube 11 is 50 millimeters, but can also be set to 10–300 millimeters.

A wiring 27 is connected between the wiring 26, connecting the upstream electrode 23 and mesh electrode 24, and the beam-emitting electrode 14. An acceleration voltage-applying device 28 is connected to the wiring 27. In the example of FIG. 2, the acceleration voltage-applying device 28 accelerates positive ions near the mesh electrode 24 toward the beam-emitting electrode 14 by applying an accelerating energy in the form of a positive high voltage. In other words, the acceleration voltage-applying device 28 applies a potential different from the potential of the plasma formed in the chamber 25 across the mesh electrode 24 and beam-emitting electrode 14. In this state, charged particles such as positive and negative ions and electrons escaping through the mesh electrode 24 to the acceleration side are accelerated toward the beam-emitting electrode 14, pass through discharge holes 14a formed in the beam-emitting electrode 14, and are irradiated externally as a beam B. According to the construction of the beam source shown in FIG. 2, the distance between the mesh electrode 24 and beam-emitting electrode 14 can be set at an arbitrary value. Accordingly, since the accelerating distance can be set arbitrarily when using high-density plasma, it is possible to form a beam of high directivity and high density, while controlling the energy level of the beam.

Figure 3:
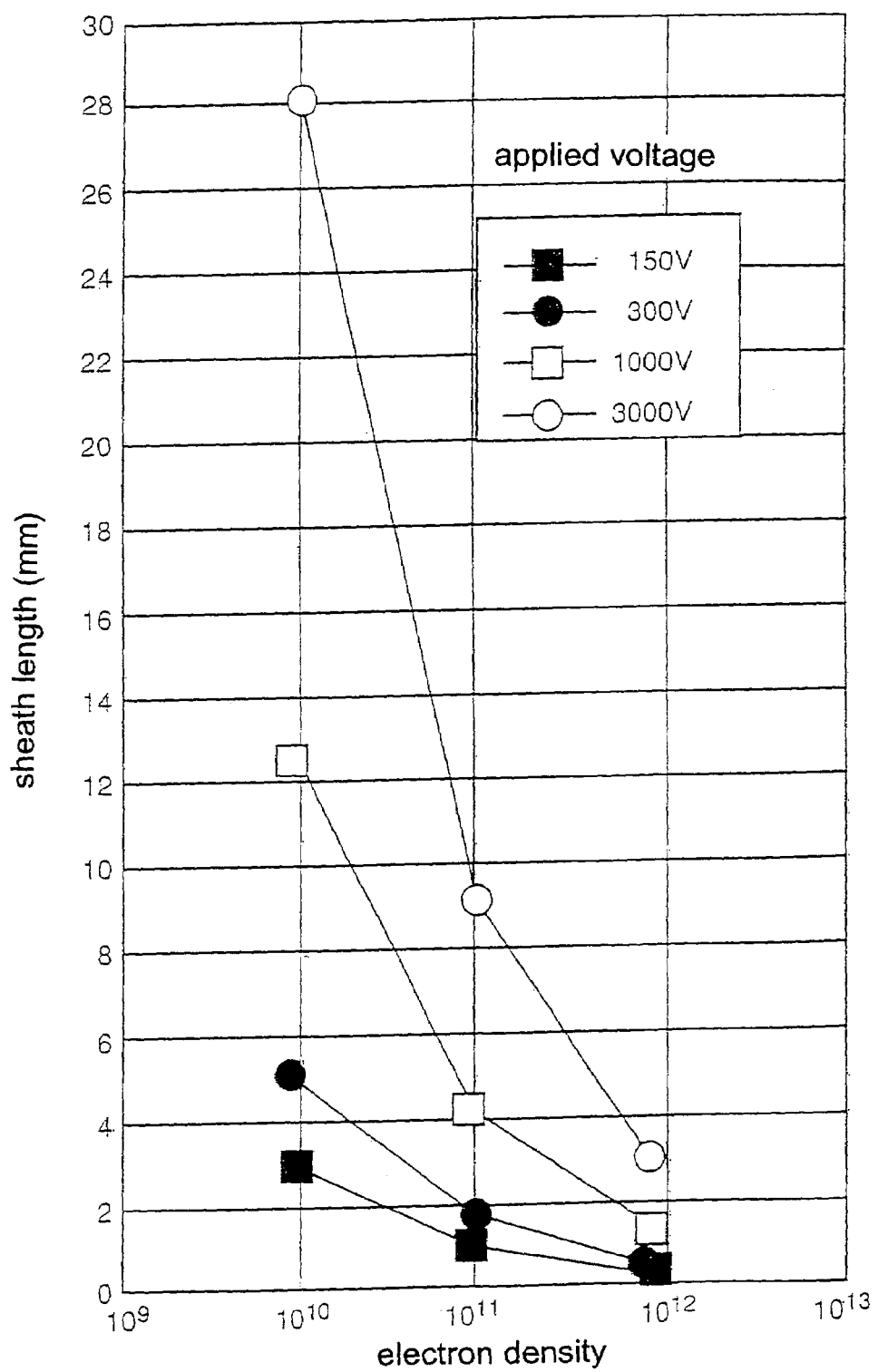
FIG. 3 is a graph showing the relationship between electron density of plasma and sheath length.

FIG. 3 shows the relationship between electron density of the plasma and the sheath length. As shown in the diagram, the higher the plasma potential (applied voltage), the longer the sheath length. As the electron density decreases, the sheath length tends to increase. In a beam generating method using a plasma sheath for ion acceleration, the length of the sheath greatly influences directivity of the beam. In principle, it is possible to generate beams with high directivity using a longer sheath length. The electron temperature in the example of FIG. 3 is 1.4 eV.

When employing the direct-current discharge method described in the prior art, generally plasma potential from about 500 V to 5 kV at an electron density of approximately $10^9$–$10^{10}$/cm$^3$ is employed. In this case, it is easy to achieve a sheath length of 10 millimeters or more. On the other hand, an electron density of $10^{11}$–$10^{12}$/cm$^3$ can be obtained by forming high-density plasma using RF discharge or the like, thereby obtaining a large quantity of accelerated ions, in other words, a high-density beam. However, often a low-energy beam less than about 500 V is required, which achieves a sheath length of 0.1–3 millimeters when using the potential difference with that sheath. On the other hand, the diameter of the discharge holes is normally set at 1 millimeter. Accordingly, the beam-emitting holes greatly influence distortion in the electric field along the sheath length when the sheath length, in other words the acceleration distance, is only about 0.1–3 millimeters. As a result, it is difficult to achieve acceleration with high directivity. However, when using a long sheath of approximately 10–30 millimeters in plasma formed by direct-current discharge or the like, described above, the effect of the beam-emitting holes on electric field distortion is smaller, making it possible to emit a beam with high directivity.

The present invention employs an electrode construction when using high-density plasma that enables beam emission with high directivity. In other words, the present invention solves the above problem by employing the mesh electrode 24 to partition the chamber 25, as shown in FIG. 2. This allows the distance between the mesh electrode 24 and beam-emitting electrode 14 to be set at an appropriate length. The mesh electrode 24 of the present embodiment employs a cross mesh having a wire thickness and width of 0.3 millimeters and a space between wires of 0.8 millimeters.

Figure 4A:
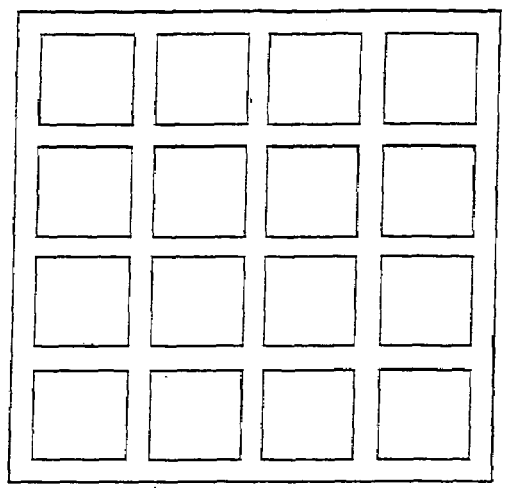
FIG. 4 shows example configurations of a mesh electrode, including a thin metal plate formed with square openings in FIG. 4A, a metal wiring woven into a mesh shape in FIG. 4B, and a thin plate constructed from a conductive material such as silicon or graphite and formed with circular openings.
Figure 4B:
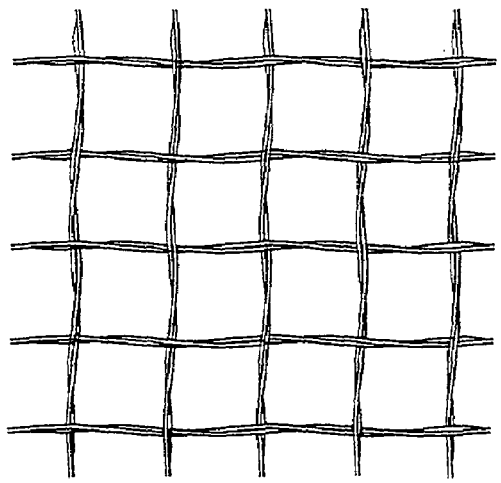
Figure 4C:
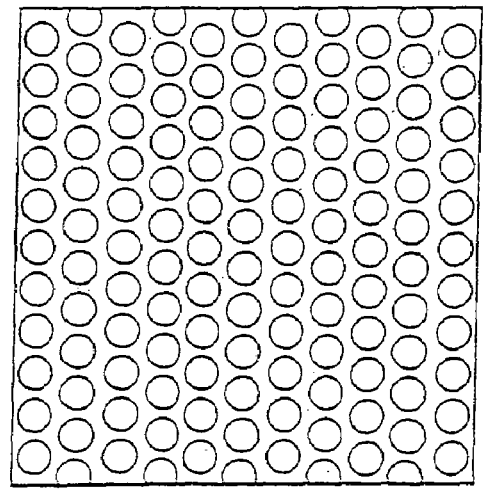

FIGS. 4A, 4B, and 4C show example formations of the mesh electrode. The mesh electrode can be configured by forming holes in a thin conductive sheet formed of metal, graphite, or the like, as shown in FIGS. 4A and 4C, or by metal wires woven together, as shown in FIG. 4B. The shape of the mesh electrode greatly affects the characteristics of the resulting beam and the processing characteristics on the object of irradiation. The mesh electrode 24 has a thickness no greater than 1 millimeter and preferably 0.1–0.5 millimeters. The mesh electrode 24 has a plurality of openings formed in the mesh, each having an open area ratio of 85% or less. Although the pattern of openings formed in the mesh is generally shaped like a checkerboard grid, as shown in the drawings, the mesh is not limited to this shape. The aspect ratio of the holes is 1 or less. Further, if the mesh is too thick, the amount of ion deactivation increases, thereby decreasing efficiency.

Figures 5A, 5B, 5C:
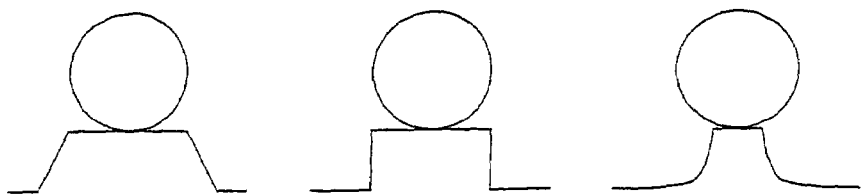
FIG. 5 is an explanatory diagram showing the effect of mesh open area ratio on the processed shape of the irradiated object.

Beam diameter, directivity, and processing speed have the following relationships to the open area ratio in the mesh. As the open area ratio increases, the beam diameter increases, directivity drops, and processing speed increases. In contrast, as the open area ratio decreases, the beam diameter decreases, directivity increases, and the processing speed decreases. The resulting shapes of the target of beam processing are shown in FIG. 5. The resulting shape is sloped, as shown in FIG. 5A, when the open area ratio is too small. A suitable anistropic etching, as shown in FIG. 5B, is achieved when the open area ratio is appropriate, but isotropic etching, as shown in FIG. 5C, results when the open area ratio is too large.

Figure 6:
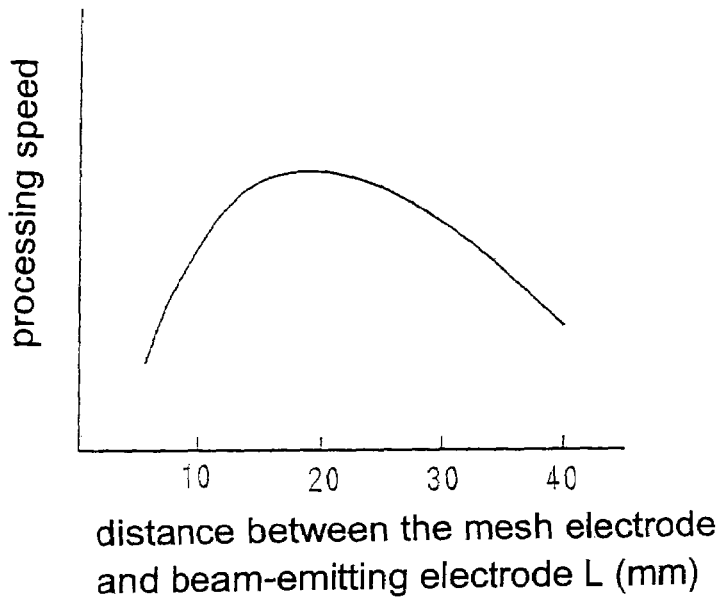
FIG. 6 is a graph showing the relationship between the distance between the mesh electrode and beam-emitting electrode and the processing speed of the irradiated object.

Similarly, when employing a relatively low energy beam suitable for such micro-fabricating processes as deposition and etching, in other words with an ion accelerating voltage of 1 kV or less, an appropriate distance L exists between the mesh electrode and the beam-emitting electrode. In FIG. 6, the X-axis represents the distance between the mesh electrode and the beam-emitting electrode, while the Y-axis represents the processing speed on the object of irradiation. As shown in FIG. 6, a beam with good processing capacity can be achieved by setting a distance L of approximately 10–30 millimeters. The distance L should be at least 5 millimeters or greater since efficient acceleration cannot be achieved when the distance L is too small. Obviously, different processing speeds will occur by varying the distance L between the mesh electrode and beam-emitting electrode, even under the same conditions.

Further, the characteristics of the beam emitting from the discharge holes 14a of the beam-emitting electrode 14 greatly differ according to the length of the discharge holes 14a. Hence, the length of the discharge holes 14a must be selected according to the desired use of the beam source. A length of 1–5 times the hole diameter is appropriate for emitting electrons, ions, radicals, neutral particles having a low neutralization rate, and the like, creating a broad beam downstream from the beam-emitting holes. When the hole length is 5–10 times the hole diameter, the beam directivity improves, enabling localized irradiation of radical and electron beams. This length can achieve a neutralization rate for a neutral particle beam of about 30–70%. When the hole length is 10 times or greater that of the diameter, it is possible to obtain a beam of even greater directivity and a neutral particle beam having a neutralization rate of about 70% or greater. In the present embodiment, the thickness of the beam-emitting electrode is 2 millimeters, while the ratio of the length of the beam-emitting holes to the hole diameter is preferably 2 or greater.

By setting the acceleration voltage-applying device 28 to a high negative voltage, the potential of plasma formed in the chamber 25 will have a high negative potential. If the beam-emitting electrode 14 is set to a zero potential, negative ions formed in the plasma can be accelerated to emit a negative ion beam. In this case, it is preferable to use a gas conducive to generating negative ions, such as $O_2$, $Cl_2$, $SF_6$, $CHF_3$, and $C_4F_8$. When generating high-density plasma through high-frequency inductive coupling or the like using such gases, numerous negative ions are generated in the plasma, facilitating the formation of a negative ion beam. When using $SF_6$ gas in a beam source having the specifications described above, a positive ion beam capable of performing anistropic processing is generated at an acceleration voltage of from +50 V to +1 kV. The processing speed of the beam source on a silicon substrate is 500 Å/min or greater. A negative ion beam is also generated at an acceleration voltage of from −50 V to −1 kV.

Figures 7A, 7B:
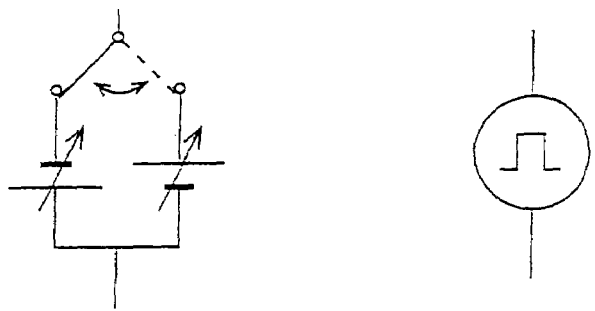
FIGS. 7A and 7B are circuit diagrams showing example configurations of an acceleration voltage-applying circuit.
Figure 8:
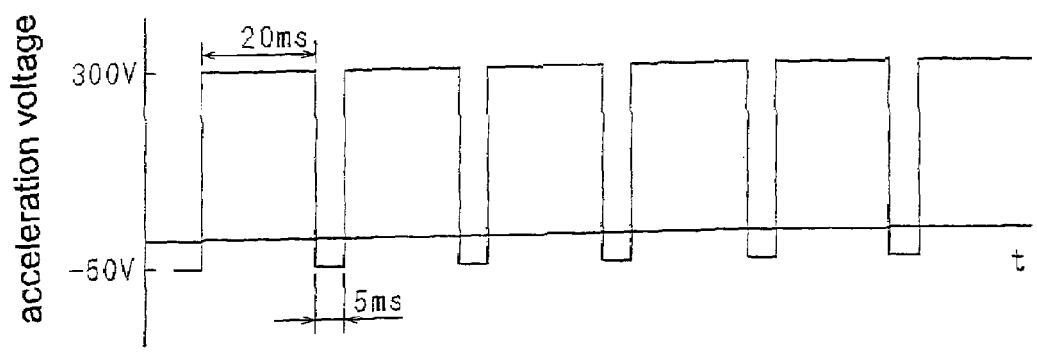
FIG. 8 is a time chart showing an example configuration for applying positive and negative acceleration voltages in pulses.

By connecting an acceleration voltage-applying device, as shown in FIG. 7A, that can be switched between a positive and negative voltage, it is possible to irradiate alternate negative and positive ion beams on a workpiece. By providing variable acceleration voltage, beams of different energy levels can be irradiated while varying the time of irradiation. It is also possible to apply a pulse type positive and negative acceleration voltage using the device shown in FIG. 7B. With this configuration, a positive ion beam and negative ion beam can be irradiated alternately in pulses. When using a gas not conducive to generating negative ions, such as argon gas, an electron and positive ion beam can be emitted alternately. In the example shown in FIG. 8, a voltage of +300 V is applied for 20 milliseconds, followed by −50 V for 5 milliseconds. Then the voltages are repeatedly applied alternately.

Hence a positive ion beam having an energy of +300 eV is emitted from the beam source over an interval of 20 milliseconds. Next, a negative ion beam (or an electron beam) having energy of −5 eV is emitted for an interval of 5 milliseconds, and the process is repeated. When processing insulating materials such as glass and ceramics, a charge tends to build up on the surface of the materials. However, by alternately irradiating positive ions and negative ions (or electrons), high-precision etching or deposition processes can be performed on these materials while restraining the amount of surface charge. In the same way, energy can be varied in pulses. This method is not limited to irradiating positive and negative ions. It is also possible to irradiate in pulses beams having the same charge (for example positive ions), but having different energies. For example, the beam source can alternately irradiate 1-keV positive ion and 1-eV positive ion beams.

Figure 9:
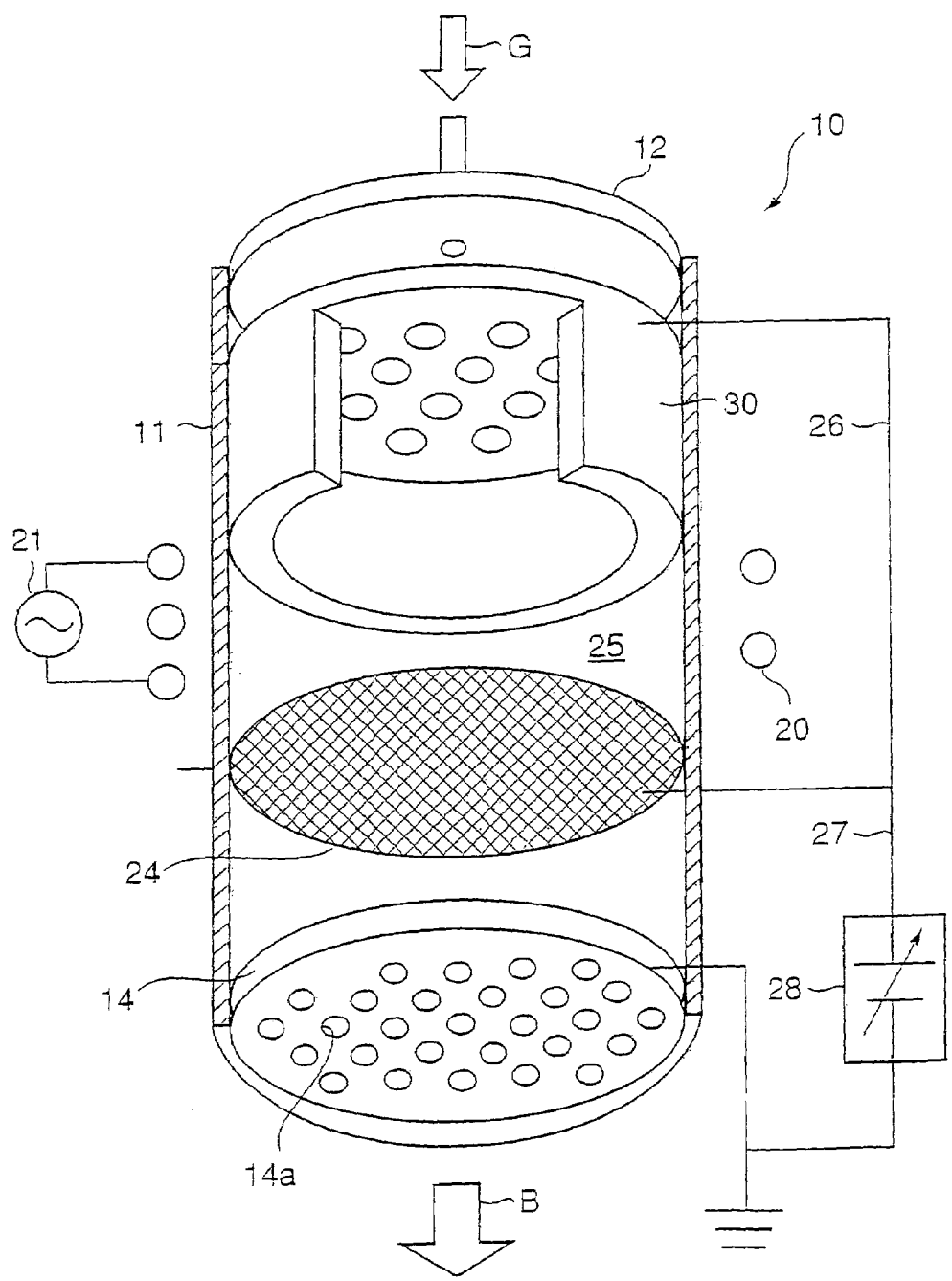
FIG. 9 is a perspective view showing the construction of a beam source according to a second embodiment of the present invention.

FIG. 9 shows a beam source according to a second embodiment of the present invention. Unlike the flat plate-like shape shown in FIG. 2, the upstream electrode 30 in this case includes a cylindrically shaped portion. The larger surface area of this electrode 30 increases the area of contact with plasma formed in the chamber 25, thereby increasing the amount of charged particles reacting on the surface of the electrode and stabilizing the potential of the plasma. The remaining construction of the beam source according to the second embodiment is the same as the beam source shown in FIG. 2 and has the same operations.

An example application for energy beams emitted from the above beam source will be briefly described. Examples of energy beams include radical beams of particles from reactant gas capable of forming a deposition layer, and low-energy neutral particle beams. When using methane gas as the source gas for the energy beam source, a radical beam containing carbon (C) is formed, generating a suitable graphite, diamond-like carbon, or the like as an adhesive.

In addition to the methane gas mentioned above, the gas supplied to the energy beam source can be a gas including a metal such as tungsten fluoride, aluminum chloride, or titanium chloride or a carbon-type or hydrocarbon-type gas, such as methane, having C or C—H. With such a gas, it is possible to deposit a tungsten film, aluminum film, titanium film, graphite film, diamond-like carbon film, hydrocarbon-containing polymer film, or the like on the object of irradiation.

In the embodiment described above, an upstream electrode, mesh electrode, and beam-emitting electrode are disposed in planes parallel to one another within a cylindrical discharge tube. The discharge tube, however, need not be cylindrical in shape, but can be elliptical or prismatic. The upper electrode does not necessarily have to be in a plane parallel to the other electrodes, providing the downstream mesh electrode and beam-emitting electrode are disposed parallel to each other.

As described above, the present invention can efficiently generate a high-density beam with high directivity from high-density plasma. Accordingly, the present invention provides a beam source capable of irradiating an energy beam, such as an ion beam or a neutral particle beam, which is suitable for micro-fabrication of semiconductors, high-density storage media, micro-machines, and the like.

INDUSTRIAL APPLICABILITY

The present invention can form an energy beam such as a high-density neutral particle beam, ion beam, or the like having a relatively large diameter and good collimation. Accordingly, the present invention is suitable for use as an energy source for such processes as deposition, etching, or the like in data storage media, such as semiconductor ICs, hard disks or the like, or in such micro-fabrication as micro-machining.

What is claimed is:

1. A beam source comprising:
a discharge tube;
a gas inlet for introducing gas into the discharge tube disposed on an upstream side of the discharge tube;
three electrodes mounted in the discharge tube downstream from the gas inlet, wherein the upstream electrode has a plurality of openings through which the gas can pass, the middle electrode is a mesh electrode, and the downstream electrode is a beam-emitting electrode having a plurality of beam-emitting holes and is disposed in a plane parallel to the middle electrode;
a plasma chamber formed between the upstream electrode and the mesh electrode, the upstream electrode and the mesh electrode connected by wiring for maintaining at approximately the same potential, and plasma-generating means disposed between the upstream electrode and the mesh electrode on the outside of the discharge tube for transforming gas introduced into the discharge tube into plasma; and
an accelerating chamber formed between the mesh electrode and the downstream electrode, the mesh electrode and the downstream electrode connected by another wiring to voltage-applying device for accelerating the beam between the mesh electrode and the downstream electrode and emitting the accelerated beam from the downstream electrode;
wherein said mesh electrode comprises a cross mesh having a wire thickness and width of 0.1–0.5 millimeters and has an open area ratio of 85% or less and an aspect ratio of open areas provided in said mesh electrode is less than 1;

wherein an accelerating voltage of 1 kV or less is applied between the mesh electrode and the downstream electrode, and the two electrodes on the downstream end are separated by a distance of 10–30 millimeters; and wherein each of the beam-emitting holes formed in the beam-emitting electrode on the downstream end has a length-to-diameter ratio of 2 or greater.

2. A beam source as claimed in claim 1, wherein the voltage-applying device applies a positive-negative pulse-type voltage that alternately irradiates either positive ions and negative ions or positive ions and electrons.

3. A beam source as claimed in claim 1, wherein said beam emitting electrode is set to zero potential.

4. A neutral particle beam source comprising:

a discharge tube;

a gas inlet for introducing gas into the discharge tube disposed on an upstream side of the discharge tube;

three electrodes mounted in the discharge tube downstream from the gas inlet, wherein the upstream electrode has a plurality of openings through which the gas can pass, the middle electrode is a mesh electrode, and the downstream electrode is a beam-emitting electrode having a plurality of beam-emitting holes and is disposed in a plane parallel to the middle electrode;

a plasma chamber formed between the upstream electrode and the mesh electrode, the upstream electrode and the mesh electrode connected by wiring for maintaining at approximately the same potential, and plasma-generating means disposed between the upstream electrode and the mesh electrode on the outside of the discharge tube for transforming gas introduced into the discharge tube into plasma; and an accelerating chamber formed between the mesh electrode and the downstream electrode, the mesh electrode and the downstream electrode connected by another wiring to a voltage-applying device for accelerating a beam between the mesh electrode and the downstream electrode and emitting the accelerated beam from the downstream electrode;

said mesh electrode comprises a cross mesh having a wire thickness and width of 0.1–0.5 millimeters and has an open area ratio of 85% or less and an aspect ratio of open areas provided in said mesh electrode is less than 1;

wherein accelerating voltage of 1 kV or less is applied between the mesh electrode and the downstream electrode and the two electrodes on the downstream end are separated by a distance of 10–30 millimeters;

wherein charge exchange takes place in said beam emitting holes formed in the downstream electrode, resulting in an emission of a neutral particle beam, and wherein each of the beam-emitting holes formed in the beam-emitting electrode on the downstream end has a length-to-diameter ratio of 2 or greater.

5. A neutral particle beam source as claimed in claim 4, wherein the voltage applying device applies a positive and negative pulse-type voltage.

6. A neutral particle beam source as claimed in claim 4, wherein the beam-emitting electrode on the downstream end has the same potential as that of a chamber into which the beam is emitted.

7. A neutral particle beam source as claimed in claim 4, wherein said beam emitting electrode is set to a zero potential.

* * * * *